(12) United States Patent
Kurimoto

(10) Patent No.: US 10,263,160 B2
(45) Date of Patent: Apr. 16, 2019

(54) LIGHT EMITTING DEVICE AND DISPLAY DEVICE

(71) Applicant: NICHIA CORPORATION, Anan-shi, Tokushima (JP)

(72) Inventor: Takeo Kurimoto, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/717,304

(22) Filed: Sep. 27, 2017

(65) Prior Publication Data
US 2018/0097151 A1  Apr. 5, 2018

(30) Foreign Application Priority Data

Sep. 30, 2016 (JP) .................. 2016-193777

(51) Int. Cl.
*H01L 33/48* (2010.01)
*H01L 25/075* (2006.01)
*G09F 9/33* (2006.01)

(52) U.S. Cl.
CPC .............. *H01L 33/483* (2013.01); *G09F 9/33* (2013.01); *H01L 25/0753* (2013.01); *H01L 33/486* (2013.01)

(58) Field of Classification Search
CPC .................. H01L 33/483; H01L 25/0753
See application file for complete search history.

(56) References Cited

U.S. PATENT DOCUMENTS

| 2003/0042844 | A1 | 3/2003 | Matsumura et al. |
| 2003/0189829 | A1* | 10/2003 | Shimizu ............. F21L 4/00 362/240 |
| 2004/0206964 | A1 | 10/2004 | Matsumura et al. |
| 2005/0127816 | A1* | 6/2005 | Sumitani ........... H01L 25/0753 313/498 |
| 2007/0097683 | A1* | 5/2007 | Chikugawa ........ H01L 25/0753 362/241 |
| 2008/0259598 | A1 | 10/2008 | Sumitani et al. |
| 2010/0224903 | A1* | 9/2010 | Cho ..................... H01L 33/60 257/99 |
| 2011/0001149 | A1 | 1/2011 | Chan et al. |
| 2011/0220949 | A1* | 9/2011 | Kim ................... H01L 33/486 257/98 |

(Continued)

FOREIGN PATENT DOCUMENTS

| JP | 11-305689 A | 11/1999 |
| JP | 2001-056647 A | 2/2001 |

(Continued)

*Primary Examiner* — Victor A Mandala
(74) *Attorney, Agent, or Firm* — Global IP Counselors, LLP

(57) ABSTRACT

A light-emitting device includes a package and at least one light-emitting element. The package includes a front surface defined by a first side and a second side opposite from the first side. The front surface includes at least one depressed portion arranged at a position closer to the first side than to the second side in plan view. The front surface further includes at least one inclined portion adjacent to the second side and inclined toward a back surface side of the package relative to a portion of the front surface adjacent to the first side. At least one light-emitting element is arranged in the at least one depressed portion.

14 Claims, 5 Drawing Sheets

(56) References Cited

U.S. PATENT DOCUMENTS

| | | | |
|---|---|---|---|
| 2011/0241028 A1* | 10/2011 | Park | H01L 33/486 257/88 |
| 2013/0026532 A1 | 1/2013 | Osumi | |
| 2013/0343061 A1* | 12/2013 | Liao | G02B 6/0035 362/296.01 |
| 2014/0054629 A1* | 2/2014 | Kim | H01L 27/15 257/91 |
| 2014/0091356 A1 | 4/2014 | Osumi | |
| 2014/0124812 A1* | 5/2014 | Kuramoto | H01L 33/54 257/98 |
| 2014/0284652 A1* | 9/2014 | Shimada | H01L 33/56 257/99 |
| 2015/0001559 A1* | 1/2015 | Sasaoka | H01L 25/0753 257/88 |
| 2015/0221840 A1 | 8/2015 | O'Brien | |
| 2015/0349224 A1* | 12/2015 | Ichihara | H01L 33/62 257/89 |
| 2016/0072028 A1* | 3/2016 | Naka | H01L 33/486 257/99 |
| 2018/0040780 A1* | 2/2018 | Hirasawa | H01L 33/62 |
| 2018/0145237 A1* | 5/2018 | Park | H01L 25/0753 |
| 2018/0212117 A1* | 7/2018 | Yu | H01L 33/36 |
| 2018/0254393 A1* | 9/2018 | Lee | H01L 33/62 |

FOREIGN PATENT DOCUMENTS

| | | |
|---|---|---|
| JP | 2003-077317 A | 3/2003 |
| JP | 2005-285874 A | 10/2005 |
| JP | 2008-270305 A | 11/2008 |
| JP | 2008-282575 A | 11/2008 |
| JP | 2008-311245 A | 12/2008 |
| JP | 2008-311246 A | 12/2008 |
| JP | 2010-206138 A | 9/2010 |
| JP | 2013-012732 A | 1/2013 |
| JP | 2013-030711 A | 2/2013 |
| JP | 2015-529393 A | 10/2015 |
| WO | 2010-034281 A1 | 4/2010 |

* cited by examiner

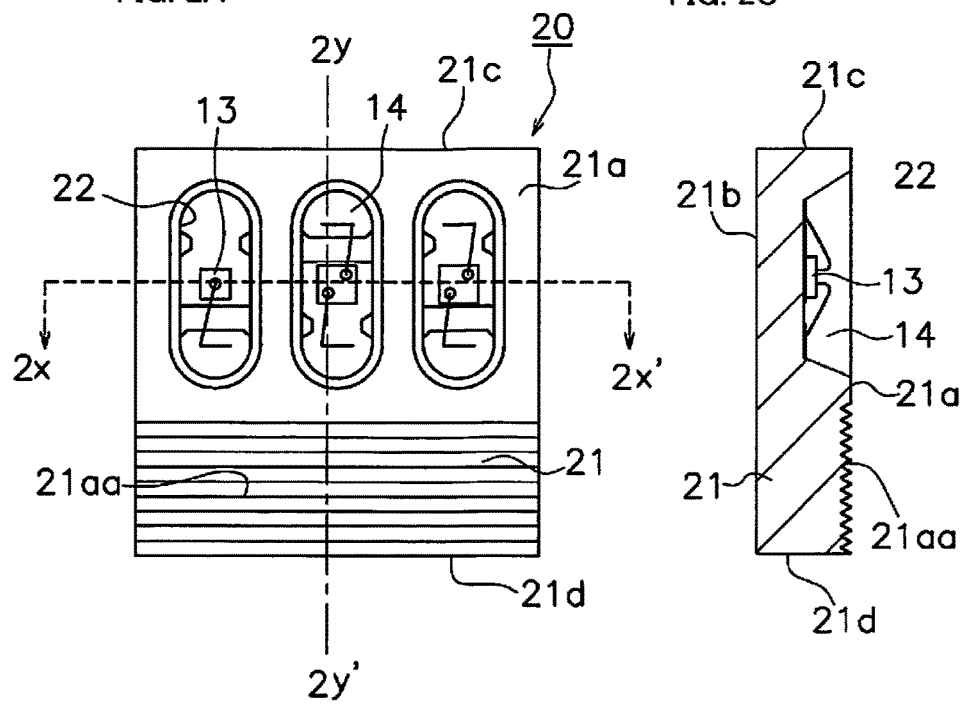

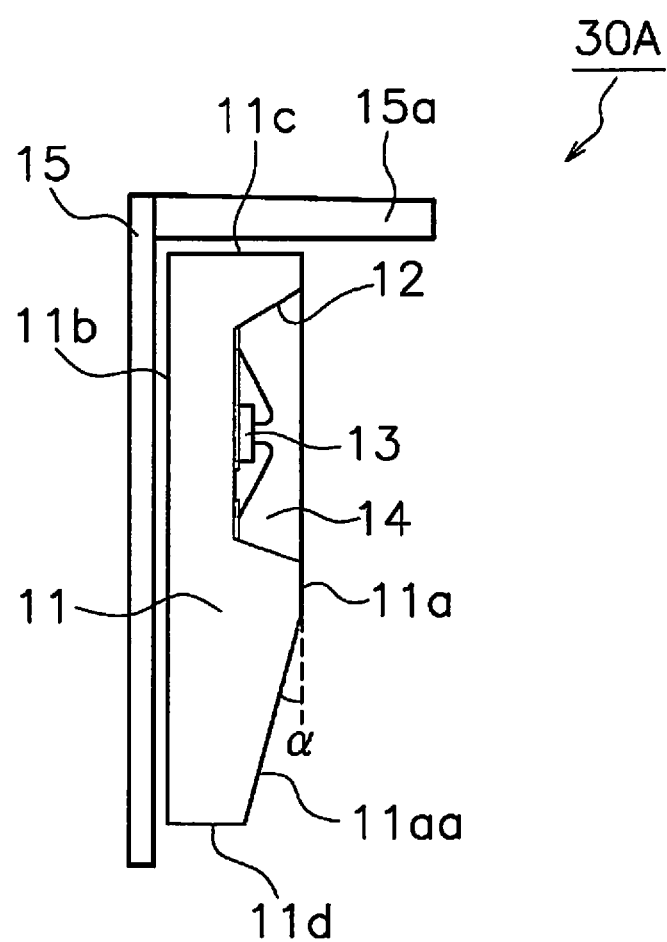

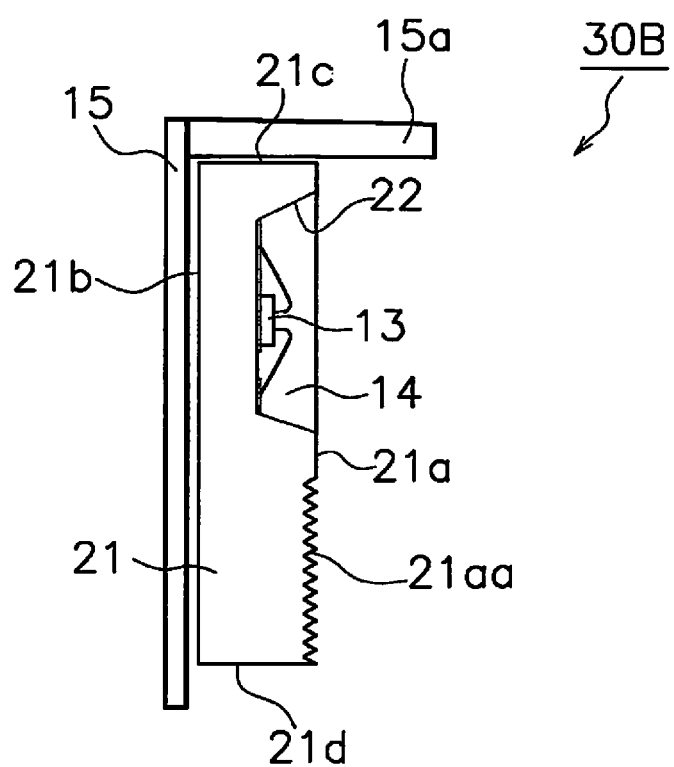

US 10,263,160 B2

LIGHT EMITTING DEVICE AND DISPLAY DEVICE

CROSS-REFERENCE TO RELATED APPLICATION

This application claims priority to Japanese Patent Application No. 2016-193777, filed on Sep. 30, 2016, the disclosure of which is hereby incorporated by reference in its entirety.

BACKGROUND

The present disclosure relates to a light-emitting device and a display device.

Display devices each including a plurality of light-emitting devices arranged in a matrix to display various images or characters have been used. Such display devices are known to cause reflection of extraneous light incident on the light-emitting surfaces (i.e., the surfaces on which light-emitting elements are disposed) of the light-emitting devices toward viewers, so that contrast of the display devices decreases and that a light-emitting surface not emitting light is wrongly recognized as if it emits light. Various developments have been made in such a manner as to reduce this contrast decrease. For example, light-emitting devices including louvers above and below light-emitting elements have been proposed (see Japanese Patent Publication No. H11-305689 and Japanese Patent Publication No. 2001-56647).

SUMMARY

As a current situation, conventional light-emitting devices have not yet achieved good contrast by sufficiently reducing effects of extraneous light such as sunlight while providing viewing angles that allow viewing from below the light-emitting devices.

The present disclosure has been made in view of the above-mentioned current situation and has an object to provide a light-emitting device suitable for a display device having higher contrast.

An embodiment herein discloses a light-emitting device includes a package and at least one light-emitting element. The package includes a front surface defined by a first side and a second side opposite from the first side. The front surface includes at least one depressed portion arranged at a position closer to the first side than to the second side in plan view. The front surface further includes at least one inclined portion adjacent to the second side and inclined toward a back surface side of the package relative to a portion of the front surface adjacent to the first side. At least one light-emitting element is arranged in the at least one depressed portion.

Another embodiment herein discloses a light-emitting device that is adapted to be used in a display device. The light-emitting device includes a package and at least one light-emitting element. The package includes a front surface defined by an upper side and a lower side opposite from the first side. The front surface includes at least one depressed portion arranged at a position closer to the upper side than to the lower side in plan view. The front surface further includes at least one inclined portion adjacent to the lower side and inclined toward a back surface side of the package relative to a portion of the front surface adjacent to the upper side. At least one light-emitting element is arranged in the at least one depressed portion. The light-emitting device is configured and arranged to be disposed in the display device so that the upper side of the front surface of the package is located on an upper side of the display device.

Still another embodiment herein discloses a display device including a base and a plurality of the light-emitting devices according to the above described embodiments arranged in a matrix on the base such that the first side of the front surface of the package of each of the light emitting devices is disposed on an upper side of the base.

According to a light-emitting device in the present disclosure, sufficient improvement in contrast is achieved by reducing light reflected on a surface on which a light-emitting element toward a viewer while providing a viewing angle that allows viewing from below the light-emitting device in the case where the light-emitting device is used for a display device.

BRIEF DESCRIPTION OF THE DRAWINGS

FIG. 2A is a schematic front view of a light-emitting device in another embodiment of the present invention.

FIG. 2B is a schematic sectional view of the light-emitting device in FIG. 2A taken along the line $2x$-$2x'$.

FIG. 2C is a schematic sectional view of the light-emitting device in FIG. 2A taken along the line $2y$-$2y'$.

FIG. 2D is a schematic enlarged view of inclined portions in the schematic sectional view of the light-emitting device in FIG. 2A taken along the line $2y$-$2y'$.

FIG. 3A is a schematic transparent side view of a display device including the light-emitting device in FIG. 1A.

FIG. 3B is a schematic transparent side view of a display device including the light-emitting device in FIG. 2A.

DETAILED DESCRIPTION OF EMBODIMENTS

Figure 1A:
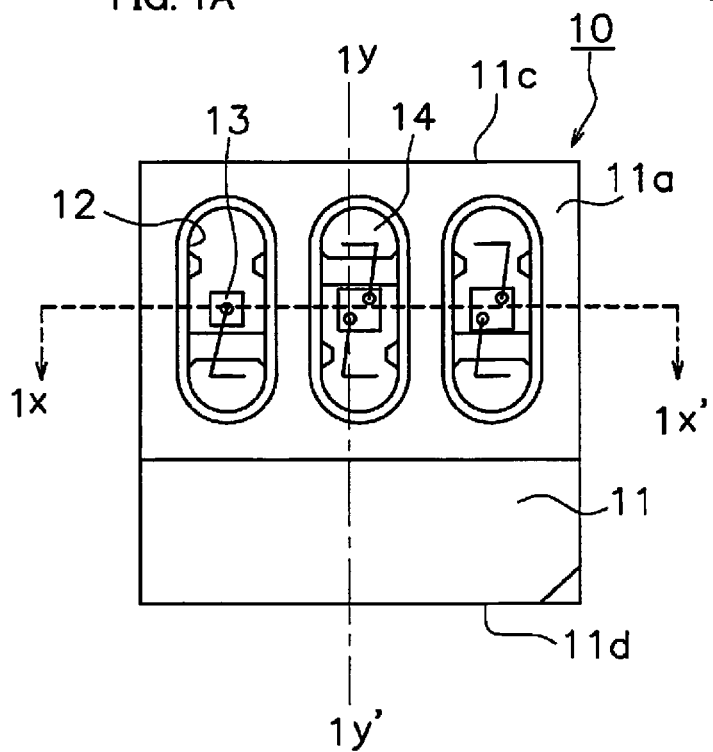
FIG. 1A is a schematic front view of a light-emitting device in one embodiment of the present invention.

The following describes embodiments of the invention with reference to the accompanying drawings as appropriate. The embodiments described below are intended to embody the technical concept of the present invention and do not limit the present invention to the followings unless specifically stated otherwise. There is a case where magnitudes or positional relations of members illustrated in the drawings are exaggerated in order to clarify the descriptions.

First Embodiment

Light-Emitting Device

Figure 1C:
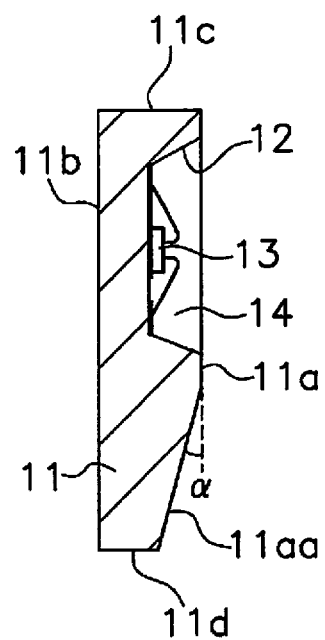
FIG. 1C is a schematic sectional view of the light-emitting device in FIG. 1A taken along the line $1y$-$1y'$.
Figure 1B:
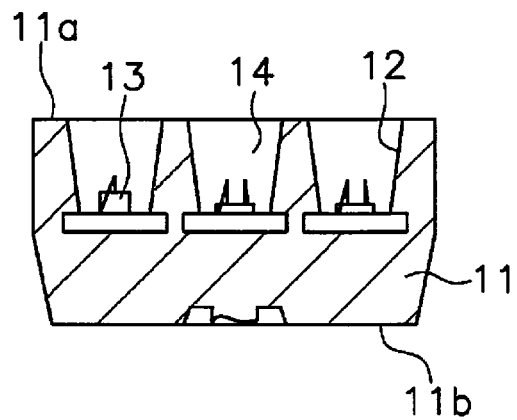
FIG. 1B is a schematic sectional view of the light-emitting device in FIG. 1A taken along the line $1x$-$1x'$.

A light-emitting device 10 in this embodiment is used for, for example, a display device and includes a package 11 that includes one or more depressed portions 12 on its front surface 11a, and one or more light-emitting elements 13 in the depressed portions 12 as shown in FIG. 1A to 1C. The depressed portions 12 are deviated to one side of the front surface 11a of the package 11 (i.e., the depressed portions 12 are arranged closer to the one side of the front surface 11*a* than to the other side), and the other side of the front surface 11*a* of the package 11 is inclined toward a back surface 11*b* side of the package 11 relative to the front surface 11*a* of the package 11 on which the depressed portions 12 are unevenly located. That is, the one side of the front surface 11*a* of the package 11 includes the depressed portions 12, and the other side of the front surface 11*a* of the package 11 includes an inclined portion 11*aa* inclined toward the back surface side of the package 11 relative to the one side including the depressed portions 12 of the front surface 11*a*. The one side of the front surface 11*a* of the package 11 is located on the upper side of a display device.

In the present application, the surface of the package 11 including the depressed portions 12 for housing the light-emitting elements 13 is referred to as the front surface 11*a*, the surface opposite to the front surface 11*a* is referred to as the back surface 11*b*, the surface that is adjacent to the front surface 11*a* and is closer to the depressed portions 12 is referred to as an upper surface 11*c*, and the surface opposite to the upper surface 11*c* is referred to as a lower surface 11*d*. Hence, the light-emitting device 10 in the present application is preferably disposed so that the upper surface 11*c* of the package 11 is positioned on the upper side and the lower surface 11*d* is positioned on the lower side when used for a display device.

Preferably, the light-emitting device 10 further includes encapsulants 14 encapsulating the light-emitting elements 13 in the depressed portions 12.

Package 11

The package 11 includes the depressed portions 12 on its front surface 11*a*. One or more depressed portions 12 may be formed. For example, the number of the depressed portions included in the light-emitting device 10 is preferably three or a multiple of three to respectively house three types of light-emitting elements that respectively have red, green, and blue emission wavelengths to obtain a full-color display device. The depressed portions 12 are positioned to be deviated to the one side, that is, the upper surface 11*c* side on the front surface 11*a* of the package 11.

The shape of each depressed portion can be selected as appropriate in consideration of the shape and optical properties of the light-emitting elements to be housed. Examples of the planar shape viewed from the front surface 11*a* side, which is the side on which emission of light is observed, include the shape of a track, circles, ellipses, squares, rectangles, polygons, and modifications of these shapes (e.g., shapes with rounded or cut-out corners). Among these shapes, a long and narrow shape is preferable. A narrow shape that elongates in the direction from the upper surface 11*c* to the lower surface 11*d* of the package 11 is preferable because the vertical directional characteristic is broadened. In the case where a plurality of depressed portions are formed, their shapes may be the same or different from one another.

The depth of one of the depressed portions is, for example, 0.4 mm to 1.4 mm. In the case where a plurality of depressed portions are formed, their depths may be the same or different from one another.

In the case where a plurality of depressed portions are formed, the depressed portions are preferably aligned in a row along the edge of the front surface 11*a* that is in contact with the upper surface 11*c* of the package. For example, in the case where a light-emitting device in which a plurality of depressed portions are aligned in the direction perpendicular to the upper surface 11*c* is used for a display device, when the display device is viewed from below, a light-emitting surface in a depressed portion nearest to a louver (i.e., nearest to the upper surface 11*c*) does not reflect extraneous light because the louver blocks the extraneous light, but only a light-emitting surface in a depressed portion farthest from the louver (i.e., nearest to the lower surface 11*d*) may reflect extraneous light that is not blocked by the louver. On the other hand, aligning a plurality of depressed portions in the direction parallel to the edge of the front surface 11*a* in contact with the upper surface 11*c* equalizes the effect on the depressed portions of extraneous light striking the depressed portions, thereby preventing or discouraging the phenomenon that only a light-emitting surface in a certain depressed portion in one light-emitting device seems to be glowing.

Deviation of the depressed portions means that the depressed portions are eccentrically positioned on the upper surface side of the package, assuming that the front surface of the package is equally divided into the upper surface side and the lower surface side. The degree of deviation is, for example, such an extent that the center (or the center of gravity) of a depressed portion is deviated to the upper surface side of the package from the bisector equally dividing the front surface of the package into the upper surface side and the lower surface side by about $1/10$ to $1/4$ of the length from the upper surface to the lower surface of the package.

For example, in the case where three or more depressed portions 12 are formed, the depressed portions 12 are preferably aligned in a row in a direction such as the direction parallel to the upper surface 11*c* (hereinafter may be referred to as the x direction) of the package 11, more preferably at regular intervals as shown in FIG. 1A. In the case where a plurality of depressed portions 12 are formed, the degrees of deviation of the depressed portions 12 to the upper surface 11*c* side are preferably about the same.

The depressed portions 12 are each defined by a bottom surface and an inner wall continuously extending from the bottom surface to the front surface 11*a* of the package 11. The light-emitting element is disposed on the bottom surface of the depressed portion 12, and part of wiring members connected to the electrodes of the light-emitting element is exposed on the bottom surface. The inner wall is preferably inclined with respect to the bottom surface. The inclination is preferably such that the shape broadens from the bottom surface toward the front surface 11*a* in view of adjustment of the mold releasability of the package and light distribution. The whole inner wall may be inclined at about the same angle, but the angle may be partially different. For example, in the case where the light-emitting device 10 is used for a display device, the inclination angle of the inner wall on the side near the upper surface is preferably larger than the inclination angle of the inner wall on the side near the lower surface with respect to the bottom surface of the depressed portion. This structure intensifies light traveling downward and improves viewability when the display device is viewed from below.

The package is preferably formed of a material that does not easily transmit light such as extraneous light and light from the light-emitting element. In particular, the outer surface of the package is preferably formed of a material having a low light reflectance for extraneous light (in many case, sunlight) and is preferably black- or dark-colored. In addition, a material having good mechanical strength is preferable, and more specific examples of a member include phenolic resins, BT resins, PPA, and ceramics. The package can be manufactured by a known method such as injection molding.

The inner lateral wall may be formed of a material that reflects light from the light-emitting element regardless of components of the package described later. That is, the inner lateral wall may be formed of another member that has a higher reflectance for light from the light-emitting element than materials constituting the front surface 11a of the package. In this case, preferably, examples of a material of the inner lateral wall include a resin containing one or more white pigments selected from titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, and zirconium oxide and/or a filler.

Examples of the planar shape of the package 11 viewed from the front surface 11a, which is the side on which emission of light is observed, include circles, ellipses, squares, rectangles, polygons, and modifications of these shapes (for example, shapes with rounded or cut-off corners). Among these shapes, a substantially rectangular shape is preferable. The front surface of the package may have fine irregularities to scatter extraneous light and improve contrast. Such fine irregularities reduce the gloss of the entire surface of the package and discourage decrease in contrast due to reflection of extraneous light. Such fine irregularities can be obtained by a treatment such as matting and making the surface porous. Examples of the treatment include sandblasting of the surface of the package and application of a paint containing a very small amount of filler (such as silicon oxide) particles. Alternatively, a porous ceramic may be used. The Ra of such fine irregularities is, for example, in a range of 1 μm to 50 μm.

Since the depressed portions are deviated to the one side of the front surface 11a of the package as described above, a region without the depressed portions is larger on the other side of the package 11. In the region, at least a portion on the side near the lower surface 11d is inclined toward the back surface 11b side of the package 11 relative to the front surface 11a of the package 11 on which the depressed portions 12 are unevenly located. That is, the package 11 includes the depressed portions 12 on the upper surface 11c side of the front surface 11a and includes the inclined portion 11aa on the lower surface 11d side of the front surface 11a. The inclined portion 11aa may also exist on the upper surface 11c side away from the depressed portions 12.

The proportion of the inclined portion 11aa to the front surface 11a is, for example, about ⅕ to ½ of the length from the upper surface to the lower surface of the package from the lower surface side of the front surface 11a of the package.

Preferably, the inclined portion 11aa is gradually inclined toward the back surface 11b side at a constant angle from the depressed portion 12 side to the lower surface 11d. Different flat surfaces may respectively constitute the one side to which the depressed portions are positioned closer and the other side including the inclined portion of the front surface 11a of the package, or the one side and/or the other side may include a curved surface. The boundary between the sides may not be clearly defined in this case. The front surface 11a can have an inclination angle α (see FIG. 1C) of the other side toward the back surface 11b side relative to the one side which the depressed portions 12 are positioned closer, in a range of 10 degrees to 45 degrees, for example. The lower surface side of the inclined portion 11aa may be in contact with the back surface 11b but is preferably away from the back surface, that is, the thickness is preferably somewhat large. This is because the mechanical strength of the lower surface side of the package is provided.

Providing such an inclination on the other side (i.e., lower side in the present embodiment) of the front surface 11a of the package 11 discourages or prevents reflected extraneous light incident on the light-emitting device from being directed to a viewer. Also, a louver is positioned at the upper surface side of the package in the case where the light-emitting device is used for a display device as described later, and therefore setting the inclination angle of the inclined portion such that reflected light strikes on the louver discourages or prevents the reflected light from being recognized by the viewer. As a result, the contrast of the display device is improved when viewed from below.

The package includes at least a pair of wiring members a part of which is exposed in the depressed portion and another part of which is exposed outside the package. Materials and shapes usually used in the art can be used for the wiring members. For example, a lead terminal can employ a plate of copper or iron plated with silver or gold and a metal film formed by plating, or the like. In the case where a plurality of pairs of wiring members are disposed to correspond to the number of the light-emitting elements, the light-emitting device can display a desired color because light emission from each light-emitting element can be separately adjusted.

Light-Emitting Elements 13

The light-emitting elements 13 are housed in the depressed portions 12. It is preferable that one light-emitting element 13 be housed in one depressed portion, but a plurality of light-emitting elements may be housed in one depressed portion. In the case where one package 11 has a plurality of depressed portions, it is preferable that the number of the light-emitting elements 13 housed be the same as or larger than the number of the depressed portions.

For example, in the case where one package includes a plurality of depressed portions each housing one light-emitting element, it is preferable that the emission wavelengths of the light-emitting elements in the respective depressed portions be different from one another or part of them be different. In particular, in the case where one light-emitting device 10 includes three types of light-emitting elements respectively having red, green, and blue emission wavelengths, a full-color light-emitting device is provided.

The light-emitting elements 13 are mounted on the above-mentioned wiring members exposed on the bottom surfaces of the depressed portions 12 using bonding members sandwiched therebetween. The pair of positive and negative electrodes of each light-emitting element 13 may be electrically connected to the pair of wiring members via wires, or the light-emitting element 13 may be flip-chip mounted on a pair of leads. Regardless of the number of light-emitting elements in one depressed portion, the light-emitting elements 13 may be disposed at the center or disposed regularly along the midline of the depressed portion, deviated to the upper surface 11c side or the lower surface 11d side, or disposed randomly in the depressed portion. The arrangement may be different between the depressed portions but is preferably the same in all depressed portions. In particular, the depressed portions are preferably uniformly deviated to the upper surface 11c side in consideration of the viewing angle that allows viewing from below.

For the light emitting element, a semiconductor light-emitting element such as light-emitting diodes can be used, for example. A light-emitting element to be employed for the light emitting element can be appropriately selected from those having an emission wavelength in any region between the ultraviolet region and the infrared region. The light-emitting element can include a light-transmissive substrate and a semiconductor layered body formed on the substrate. Examples of materials of the light transmissive-substrate include a light-transmissive insulating material such as sapphire ($Al_2O_3$) or a semiconductor material (e.g., a nitride semiconductor material) that transmits light emitted from the semiconductor layered body. The semiconductor layered body includes a plurality of semiconductor layers such as an n-type semiconductor layer, a light-emitting layer (i.e., active layer), and a p-type semiconductor layer. Examples of the material of the semiconductor layers include semiconductor materials such as group III-V compound semiconductors and group II-VI compound semiconductors. Specifically, a nitride semiconductor material such as $In_XAl_YGa_{1-X-Y}N$ ($0≤X$, $0≤Y$, $X+Y≤1$) can be used. The light-emitting element may include a pair of electrodes on the same side or include the pair of electrodes on different sides. A good electrical conductor such as metals including Au and Cu is preferably used for the pair of electrodes.

To achieve full-color display, a preferable combination of emission wavelengths of the light-emitting elements is a red emission wavelength in a range of 610 nm to 700 nm, a green emission wavelength in a range of 495 nm to 565 nm, and a blue emission wavelength in a range of 430 nm to 490 nm.

Encapsulants 14

The encapsulants encapsulating the light-emitting elements 13 in the depressed portions 12 are preferably disposed in the depressed portions 12 of the package 11.

The encapsulants can be formed of, for example, a light-transmissive resin. The term "light-transmissive" here means that 60% or more, preferably 70% or more of light emitted from the light-emitting element is transmitted. Examples of the light-transmissive resin include silicone resins, epoxy resins, phenolic resins, polycarbonate resins, acrylic resins, or modified resins or hybrid resins of these, and glass. These materials can be used singly or in combination of two or more materials.

The encapsulants may contain colorants, phosphors, light-diffusing materials, and/or fillers. In the case where the encapsulants contain colorants, the colorants contained preferably have colors similar to the colors corresponding to the emission wavelengths of the light-emitting elements in the depressed portions. The similar colors here mean adjacent colors in a hue circle (12 colors) calculated with red (FF0000) displayed by a computer being the starting point.

In the case where package 11 has a plurality of depressed portions housing light-emitting elements respectively including different emission wavelengths, each of the depressed portions contains an encapsulant containing a colorant having a color similar to the color corresponding to the emission wavelength of the light-emitting element disposed in each depressed portion. For example, a red coloring agent is added to an encapsulant encapsulating a depressed portion housing a light-emitting element having a red emission wavelength, a green coloring agent is added to an encapsulant encapsulating a light-emitting element having a green emission wavelength, and a blue coloring agent is added to an encapsulant encapsulating a light-emitting element having a blue emission wavelength.

In the case where the encapsulants contain colorants having colors similar to the colors corresponding to the emission wavelengths of the light-emitting elements disposed in the depressed portions, the contrast of the display device is further improved if the light-emitting device is used for a display device.

A phosphor contained in an encapsulant can be selected in consideration of the wavelength of light emitted from a light-emitting element used and an intended color of light. Specific examples include cerium-activated yttrium-aluminum-garnet (YAG), cerium-activated lutetium-aluminum-garnet (LAG), and europium- and/or chromium-activated nitrogen-containing calcium aluminosilicate (CASN). A plurality of types of phosphors may be used in combination. For example, color rendering properties and color reproducibility can be adjusted by using phosphors having different emission colors in a combination or mixing ratio suited to a desired color.

For example, in the case where the package 11 includes a plurality of depressed portions, a full-color light-emitting device is provided by disposing, for example, an ultraviolet light-emitting element in each of the depressed portions and disposing an encapsulant containing a blue light emitting phosphor in a certain depressed portion, an encapsulant containing a green light emitting phosphor in another depressed portion, and an encapsulant containing a red light emitting phosphor in still another depressed portion. Alternatively, a full-color light-emitting device may be provided by disposing a light-emitting element having a blue emission wavelength in each of the depressed portions and disposing an encapsulant containing no phosphor in a certain depressed portion, an encapsulant containing a green light emitting phosphor in another depressed portion, and an encapsulant containing a red light emitting phosphor in still another depressed portion.

The light-emitting device in the present disclosure may include other members, for example, a protective element such as Zener diodes and capacitors in order to protect the light-emitting elements against static electricity and overvoltage.

In FIG. 1A, the package 11 includes three depressed portions 12 each having substantially the same shape and size along the direction parallel to the upper surface 11c, and each of light-emitting elements 13 respectively having red, green, and blue emission wavelengths is housed in respective one of the three depressed portions 12. The outer appearance of the package 11 viewed from the front surface 11a side (e.g., the light-emitting surface of the light-emitting device) has 3 mm×3 mm dimensions of substantial quadrilateral shape, and the shape of the opening of each depressed portion 12 is substantially the shape of a track. The depressed portions 12 each have an opening dimensions of, for example, 1.6 mm in major axis length and 600 μm in minor axis length and have a depth of 1.4 mm, and the interval between them is 300 μm. The end of each depressed portion 12 on the upper surface 11c side is 300 μm away from the outer edge of the package 11, and the end of each depressed portion 12 on the lower surface 11d side is 1.1 mm away from the outer edge of the package 11. The front surface 11a of the package 11 includes the inclined portion 11 as that approaches the back surface 11b in a region with a width of 1 mm on the lower surface 11d side. The inclination angle α of the inclined portion 11aa is 30 degrees.

Second Embodiment

Light-Emitting Device

Similarly to the light-emitting device 10, a light-emitting device 20 in this embodiment is used for a display device and includes, for example, a package 21 that includes one or more depressed portions 22 on its front surface 21a, and the light-emitting elements 13 in the depressed portions 22 as shown in FIG. 2A.

Package 21

The package 21 includes the depressed portions 22 on its front surface. The depressed portions 22 are deviated to one side, that is, the side near an upper surface 21c, of the front surface 21a of the package 21. The other side, that is, the side near the lower surface, of the front surface 21a of the package 21 includes inclined portions 21aa inclined toward the back surface side of the package 21 relative to the front surface 21a of the package 21 on which the depressed portions 22 are unevenly located.

As shown in FIG. 2C, the front surface 21a of the package 21 includes a plurality of inclined portions 21aa in a region from the depressed portions 22 to the lower surface 21d side. Specifically, the front surface 21a of the package 21 includes the inclined portions 21aa and other inclined portions in a region from the depressed portions 22 to the lower surface 21d side. The inclined portions 21aa are inclined surfaces facing the lower surface 21d side, and the other inclined portions are inclined surfaces facing the upper surface 21c side. The inclined portions 21aa and the other inclined portions are alternately disposed in such a manner as to form a zigzag configuration in a sectional view. Preferably, both of the inclined portions 21aa in which inclined surfaces face the lower surface 21d side and the inclined portions in which inclined surfaces face the upper surface side are inclined toward the back surface 21d side at a constant angle relative to the front surface 21a and are repeatedly formed at a constant pitch. Examples of the inclination angle here include 10 degrees to 60 degrees. Examples of the pitch include 10 μm to 100 μm. The package is substantially the same as the package described referring to FIG. 1A to 1C except for this zigzag configuration of the inclined portions in a sectional view.

Providing such inclined portions on the lower side of the front surface 21a of the package 21 also prevents or discourages reflected extraneous light incident on the light-emitting device from being directed to a viewer. Hence, the contrast when a display device including the light-emitting device 20 is viewed from below is improved.

In the inclined portions 21aa of the package 21 in FIG. 2C, for example, a pitch P is 30 μm, an inclination angle β of the inclined portions 21aa in which inclined surfaces face the lower surface side is 30 degrees, and an inclination angle γ of the inclined portions in which inclined surfaces face the upper surface side is 30 degrees.

Except for the above-mentioned structure, the other part of the structure is substantially the same as the corresponding part of the structure of the light-emitting device 10.

Third Embodiment

Display Device

Display devices 30A and 30B in this embodiment are made by disposing each of the above-mentioned light-emitting devices 10 and 20 on a base 15 as shown in FIGS. 3A and 3B. One light-emitting device 10 or 20 is illustrated here, but preferably a plurality of light-emitting devices 10 or 20 are disposed on the base 15, more preferably in a matrix.

In the light-emitting device 10 or 20, the depressed portion 12 or 22 is positioned to the upper surface side of the front surface 11a or 21a, and the inclined portion(s) 11aa or 21aa is positioned at the lower side of the front surface 11a or 21a.

The base 15 here can be used to fix the light-emitting device and mitigates direct irradiation of the light-emitting elements with extraneous light such as sunlight. To achieve these, for example, a louver 15a is preferably disposed on the upper end side and/or the lower end side of the light-emitting device. The louver 15a may be disposed singly, for example, above and/or below each light-emitting device, or may be disposed singly above and/or below each set of a plurality of light-emitting devices. Alternatively, the louver 15a may be disposed singly above and/or below one display device. In the case where a plurality of louvers 15a are disposed along the vertical direction, it is sufficient that the louvers 15a are disposed at least above, and in the case where the louvers 15a are also disposed below, they may serve also as upper louvers for the adjacent row below.

The shape and size of the louver 15a can be selected as appropriate as long as the louver 15a effectively blocks light, such as extraneous light, coming in from obliquely upward the display device. For example, the height of the louver 15a can be selected as appropriate depending on the size, installation location, and installation angle of the display device and the mounting pitch of light-emitting devices. For example, the louver 15a is about 2 mm to 5 mm away from the upper surface of the light-emitting device. The louver 15a is, for example, preferably at an angle of 90 degrees to the surface of the base 15 but may be inclined at about 30 degrees upward or downward. In the case where the louvers 15a are disposed above and below the light-emitting devices arranged in a matrix, the inclination angles of the louvers may vary depending on their positions in the vertical direction. For example, the inclination angles may become larger or smaller toward the lower direction. This structure further reduces reflected light traveling toward the eyes of a viewer.

In the case where the package of the light-emitting device includes a plurality of depressed portions, the louver 15a is preferably disposed along the depressed portions, that is, parallel to the upper or lower surface of the package.

In the display device, a unit pixel constituted of the light-emitting device arranged on the base 15 may include one light-emitting element, that is, a monochromatic light-emitting element, but preferably includes three or more light-emitting elements of red (R), blue (B), and green (G) in the case of color display. The number of the light-emitting elements can be adjusted as appropriate depending on the brightness of the elements required for the light-emitting device. For example, a single light-emitting device including one red light-emitting element, one green light-emitting element, and one blue light-emitting element can be used to constitute one pixel. Alternatively, one pixel may be constituted by arranging one red light-emitting element, two green light-emitting elements, and one blue light-emitting element in one or more light-emitting devices.

The pattern of arrangement of the light-emitting elements in a pixel can be selected as appropriate in consideration of display quality. Hence, it is preferable that the light-emitting device include three depressed portions aligned parallel to the upper surface of the package and that the depressed portions respectively house light-emitting elements corresponding to RGB.

In the case where a plurality of light-emitting devices are arranged in a matrix, distances between adjacent light-emitting devices are preferably as small as possible.

Examples of the material of the base 15 generally include plastics (including polycarbonate resins, ABS resin, epoxy resins, and phenolic resins), glass, ceramics, or metals (including a single metal of aluminum or copper and alloys of such single metals containing a metal such as Mg, Si, Fe, Cu, Mn, Cr, Zn, Ni, Ti, Pb, and Sn). Alternatively, a material that combines these materials can be used. Among these, plastics, particularly polycarbonates containing glass fiber, are preferable because it is comparatively easy to improve the weather resistance and mechanical strength. Also, it is comparatively easy to impart a dark color such as black to the base itself by adding a coloring agent.

As described above, the display device in the present embodiment can reduce reflection of extraneous light coming from in a range of horizontal direction to obliquely upward direction toward the display observation direction while providing a viewing angle that allows viewing from below, thereby improving the contrast.

In other words, it can mitigate phenomenon that the light emitting surface of the package becomes too bright when extraneous light strikes thereon, or that a unlit light emitting device glows as if it is lit state when extraneous light strikes on the light-emitting surface of the package.

Forming a plurality of depressed portions in one light-emitting device reduces the surface area of the front surface of the light-emitting device, thereby further mitigating effects of extraneous light reflected on the front surface around the depressed portions. In addition, by forming the depressed portions on the front surface of the light-emitting device, positioning the depressed portions deviated to a certain direction effectively prevents or discourages false recognition as glowing due to irradiation of extraneous light. In particular, providing the inclined portion on the other end side, that is, the lower side, of the front surface of the package effectively prevents or discourages reflected extraneous light from being directed to a viewer. Particularly in the case where the display device is provided with a louver, providing the inclined portion on the lower side of the package allows reflected extraneous light to strike on the louver, thereby enabling of blocking the reflected extraneous light. In addition, positioning the depressed portions to be deviated to one side facilitates arrangement in the vertical direction in assembling the display device and enables the manufacturing process to be simplified.

Fourth Embodiment

Display Device

Figure 4A:
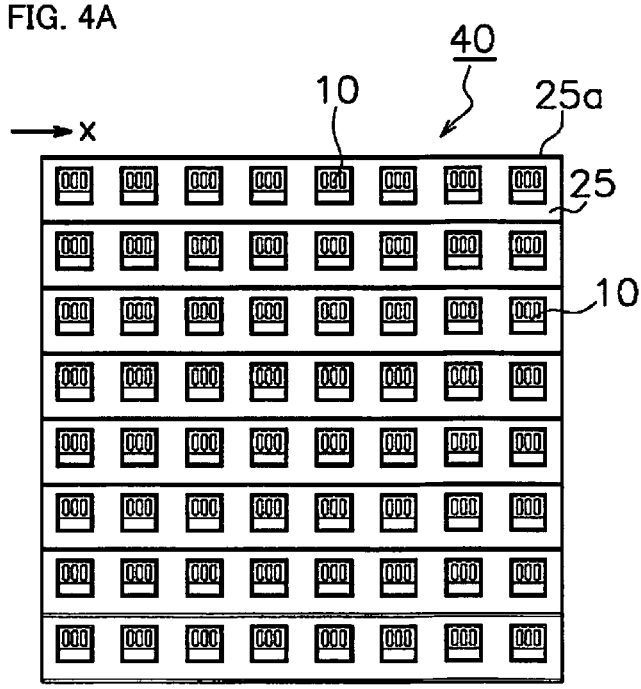
FIG. 4A is a schematic front view of another display device including the light-emitting device in FIG. 1A.
Figure 4C:
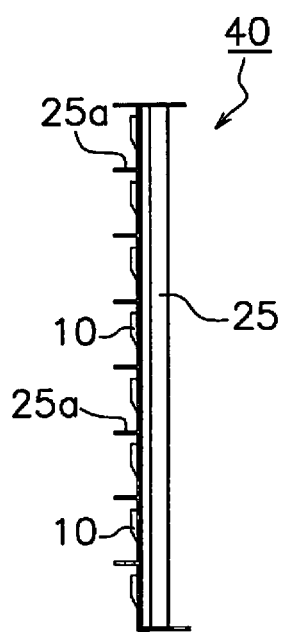
FIG. 4C is a schematic side view of the display device in FIG. 4A.
Figure 4B:
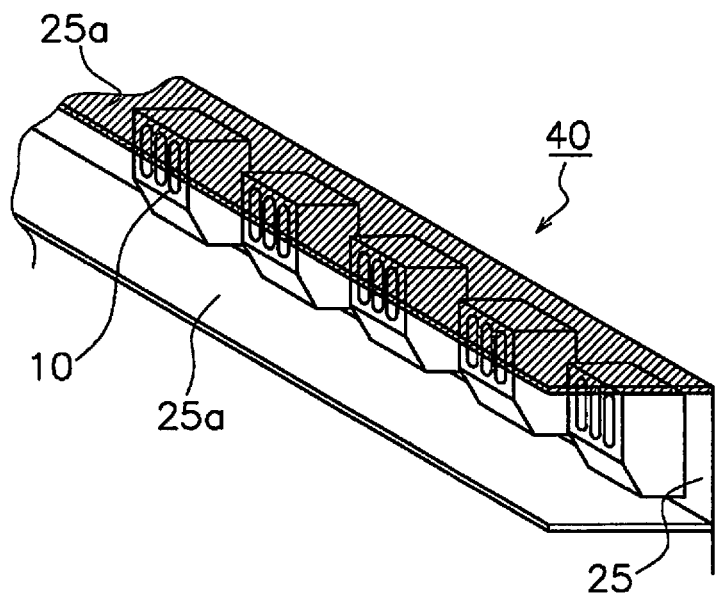
FIG. 4B is a schematic enlarged perspective view of a portion of the display device in FIG. 4A.

In this display device 40, a plurality of light-emitting devices 10 are arranged in a matrix on a base 25 as shown in FIGS. 4A to 4C. For example, the display device 40 can include a plurality of units each including the base 25 on which light-emitting devices 10 are arranged in 16 rows×16 columns. A plurality of such units arranged in a matrix can constitute a large-screen display device 40.

The distance between the light-emitting devices 10 in the display device 40 is, for example, 3 mm (e.g., 6 mm pitch), and each louver 25a is disposed at a position deviated from the center between rows along the X direction, that is, the horizontal direction, of the light-emitting devices 10 to the lower side in the Y direction, that is, the vertical direction. The louvers 25a are disposed about 3 mm away from the upper surfaces of the light-emitting devices 10.

The display device 40 in which the light-emitting devices 10 are arranged provides effects similar to the above-mentioned effects.

The present disclosure can be effectively used for a display device, in particular, a high-definition color display device having high contrast even when used outdoors.

What is claimed is:

1. A light-emitting device comprising:
  a package including a front surface defined by a first side and a second side opposite from the first side, the front surface including at least one depressed portion arranged at a position closer to the first side than to the second side in plan view, the front surface further including at least one inclined portion adjacent to the second side and inclined toward a back surface side of the package relative to a portion of the front surface adjacent to the first side; and
  at least one light-emitting element arranged in the at least one depressed portion.

2. The light-emitting device according to claim 1, wherein the at least one depressed portion includes a plurality of depressed portions.

3. The light-emitting device according to claim 2, wherein the plurality of depressed portions are located along the first side of the front surface of the package.

4. The light-emitting device according to claim 2, wherein the at least one light emitting element includes a plurality of light-emitting elements respectively arranged in the plurality of depressed portions, and
  the plurality of light-emitting elements have different emission wavelengths.

5. The light-emitting device according to claim 4, further comprising
  at least an encapsulant arranged in each of the plurality of depressed portions, the encapsulant contains a colorant having a color similar to a color corresponding to an emission wavelength of each of the plurality of light-emitting elements.

6. The light-emitting device according to claim 1, wherein an inclination angle of the at least one inclined portion relative to the portion of the front surface adjacent to the first side is 10 degrees to 45 degrees.

7. The light-emitting device according to claim 1, wherein a length of the at least one inclined portion in a direction from the first side to the second side of the front surface is $\frac{1}{5}$ to $\frac{1}{2}$ of a length of the front surface from the first side to the second side.

8. The light-emitting device according to claim 1, wherein the at least one inclined portion includes a plurality of inclined portions.

9. The light-emitting device according to claim 1, wherein the package includes an outer surface having black color.

10. The light emitting device according to claim 1, wherein
  the at least one depressed portion has a depth in a range of 0.4 mm to 1.4 mm.

11. The light emitting device according to claim 2, wherein
  the number of the plurality of depressed portions is three or multiple of three.

12. The light emitting device according to claim 1, wherein
  the at least one depressed portion has a narrow shape that is elongated in a direction from the first side to the second side of the front surface in plan view.

13. A display device comprising:
  a base; and a plurality of the light-emitting devices according to claim 1 arranged in a matrix on the base such that the first side of the front surface of the package of each of the light emitting devices is disposed on an upper side of the base.

14. A light-emitting device adapted to be used in a display device, the light-emitting device comprising:
a package including a front surface defined by an upper side and a lower side opposite from the side, the front surface including at least one depressed portion arranged at a position closer to the upper side than to the lower side in plan view, the front surface further including at least one inclined portion adjacent to the lower side and inclined toward a back surface side of the package relative to a portion of the front surface adjacent to the upper side; and
at least one light-emitting element arranged in the at least one depressed portion,
wherein the light-emitting device is configured and arranged to be disposed in the display device so that the upper side of the front surface of the package is located on an upper side of the display device.

* * * * *